United States Patent
Willis et al.

(10) Patent No.: US 7,526,693 B1
(45) Date of Patent: Apr. 28, 2009

(54) INITIAL DECISION-POINT CIRCUIT OPERATION MODE

(75) Inventors: David J. Willis, Murray, UT (US); Matthew Austin Tyler, Kaysville, UT (US); Justin Mark Gedge, Eagle Mountain, UT (US); Mark R. Whitaker, Draper, UT (US)

(73) Assignee: Semiconductor Components Industries, LLC, Phoenix, AZ (US)

( * ) Notice: Subject to any disclaimer, the term of this patent is extended or adjusted under 35 U.S.C. 154(b) by 359 days.

(21) Appl. No.: 11/371,661

(22) Filed: Mar. 9, 2006

(51) Int. Cl.
 *G01R 31/28* (2006.01)
(52) U.S. Cl. .......................... 714/724; 714/36; 714/48; 714/740; 714/742; 702/98; 702/85; 365/225.7; 365/185.03; 712/39; 712/40; 712/43; 318/568.17; 318/590; 318/400.09; 318/400.11; 710/14
(58) Field of Classification Search ....................... None
See application file for complete search history.

(56) References Cited

U.S. PATENT DOCUMENTS

| | | | | |
|---|---|---|---|---|
| 4,656,632 A * | 4/1987 | Jackson | ....................... | 714/736 |
| 5,241,850 A * | 9/1993 | Kawate | ....................... | 73/1.88 |
| 5,805,466 A * | 9/1998 | Roeckner et al. | ............... | 702/98 |
| 6,041,007 A * | 3/2000 | Roeckner | ................. | 365/225.7 |
| 6,185,127 B1 * | 2/2001 | Myers et al. | ............ | 365/185.03 |
| 6,321,354 B1 * | 11/2001 | Prunier | ........................ | 714/726 |
| 6,424,168 B1 * | 7/2002 | Farnworth et al. | ........... | 324/765 |
| 6,497,146 B1 * | 12/2002 | Hobbs et al. | .............. | 73/504.12 |
| 6,657,451 B2 * | 12/2003 | Meli | ........................... | 324/765 |
| 6,888,765 B1 * | 5/2005 | Kotowski et al. | ............. | 365/201 |
| 7,197,680 B2 * | 3/2007 | Kimelman et al. | ........... | 714/724 |
| 2005/0229055 A1 * | 10/2005 | Merk | .......................... | 714/724 |
| 2006/0087307 A1 * | 4/2006 | De Winter | ................ | 324/76.47 |
| 2007/0090848 A1 * | 4/2007 | Tumin et al. | ................. | 324/761 |

OTHER PUBLICATIONS

A Chopped Hall Sensor With Programmable "True Power-On" Function; Mario Motz, Dieter Draxelmayr, Tobias Werth, Bernhard Forster; p. 443-446; 2004 IEEE.
MLX90316; Rotary Position Sensor IC; p. 1-34; Oct. 4, 2005.

* cited by examiner

*Primary Examiner*—John P Trimmings
(74) *Attorney, Agent, or Firm*—Workman Nydegger

(57) ABSTRACT

A circuit that includes a controller and at least one control I/O pin. When the controller is placed into an initial state, the controller initializes the circuit into an initial operation mode. Depending on whether or not signal(s) satisfying predetermined criteria are applied to at least one of the control I/O pins, the controller will cause the circuit to enter one of two or more post-initial operation modes. Accordingly, by initializing the controller, and by controlling a signal on the control I/O pin(s), the operating mode of the circuit may be controlled. In one embodiment, a given control pin might be configurable to be both analog and digital, depending on the circuit's operation mode.

31 Claims, 7 Drawing Sheets

INITIAL DECISION-POINT CIRCUIT OPERATION MODE

CROSS-REFERENCE TO RELATED APPLICATIONS

Not applicable.

BACKGROUND OF THE INVENTION

Electronic circuitry provides complex functionality that is proving ever more useful. Some circuits even operate in one of multiple operation modes, typically a normal operation mode and a single alternative operation mode. For instance, a circuit may operate in configuration mode when not in a normal mode of operation. Other examples of alternative operation modes include, for example, testing mode, calibration mode, and the like.

There are a variety of techniques for transitioning a given circuit from one operation mode to another. Many involve signaling the circuit using voltages that are not typical for normal operation of the circuit. For instance, the transition may be initiated by modulating the power supply outside of its normal range. For circuits that are flexible enough to operate normally with a wide range of supply voltages, it may be quite difficult or impractical to modulate the power supply to be outside of its normal range. Another mechanism is to overdrive the voltage on an input/output (I/O) pin of the circuit. However, for circuits that have a low drive resistance, this may cause excessive current to pass through the circuit.

BRIEF SUMMARY OF THE INVENTION

Embodiments of the present invention relate to a circuit that includes a controller and at least one I/O pin. When the controller is placed into an initial state, the controller initializes the circuit into an initial operation mode. Depending on whether or not signal(s) satisfying predetermined criteria are applied to an I/O pin, the controller will cause the circuit to enter one of two or more post-initial operation modes. Accordingly, by initializing the controller, and by controlling a signal on the control I/O pin(s), the operating mode of the circuit may be controlled. In one embodiment, a given control pin would be configurable to be analog or digital, or switchable therebetween, depending on the circuit's operation mode.

These and other features of the embodiments of the present invention will become more fully apparent from the following description and appended claims, or may be learned by the practice of the invention as set forth hereinafter.

BRIEF DESCRIPTION OF THE DRAWINGS

To further clarify the above and other advantages and features of the present invention, a more particular description of the invention will be rendered by reference to specific embodiments thereof which are illustrated in the appended drawings. It is appreciated that these drawings depict only typical embodiments of the invention and are therefore not to be considered limiting of its scope. The invention will be described and explained with additional specificity and detail through the use of the accompanying drawings in which.

DETAILED DESCRIPTION OF THE PREFERRED EMBODIMENTS

Figure 1:
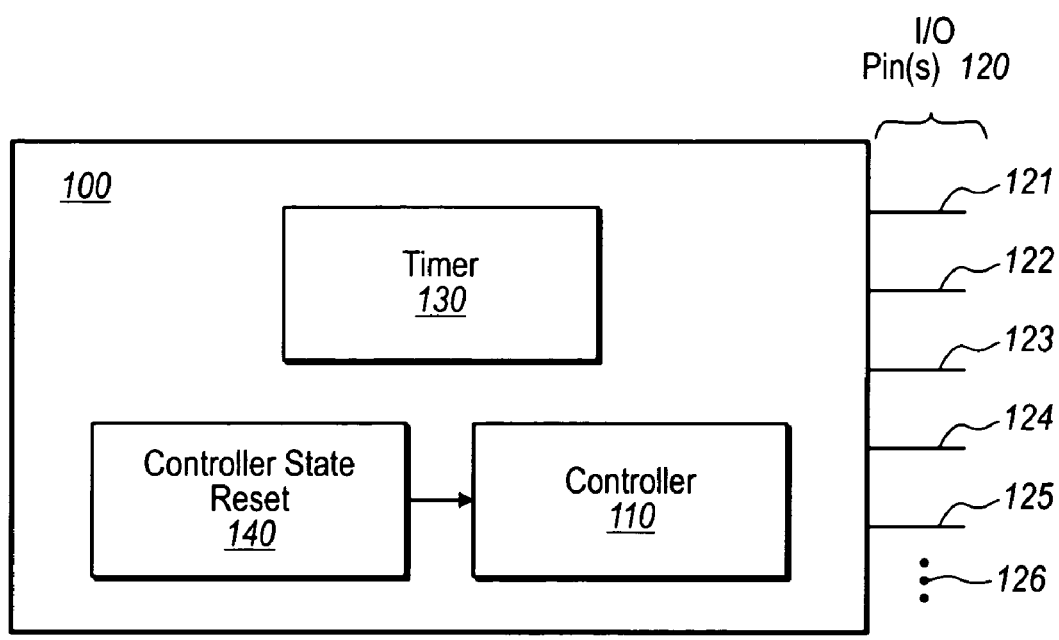
FIG. 1 illustrates a high-level schematic block diagram of a circuit in accordance with an embodiment of the present invention.

FIG. 1 is a schematic block diagram of a circuit 100 in accordance with a general embodiment of the present invention. The circuit 100, which may be a single integrated circuit, includes a controller 110, one or more input/output (I/O) pins 120, and optionally a timer 130 and a controller state reset component 140.

As with the other circuit drawings provided herein, FIG. 1 is only a circuit block diagram that is used to introduce some basic components that may be used to practice embodiments of the present invention. Accordingly, the figure is not drawn to scale, nor does the placing of the various component imply any sort of actual physical position or connectivity on an integrated circuit.

Although the circuit 100 is illustrated as containing multiple I/O pins 120 including pins 121 through 125, the vertical ellipses 126 represents that the integrated circuit may contain any positive integer (one or more) of pins which may be configured as digital only, analog only, or switchable between digital and analog, depending on the circuit's operation mode. One or more of the I/O pins 120 may be control pins that are used to set the operation mode of the circuit or transition between operation modes. In one embodiment, at least one of the control pins is configured to switch between analog and digital depending on the circuit's operation mode. For instance, one of the control pins may be configured as a digital input pin when using that control pin to set the operation mode of the circuit. That same control pin is configured as an analog pin when the circuit enters the operation mode set through that control pin. The circuit 100 may even include a single I/O pin that acts as a control pin to set the operation mode of the circuit 100, and that may be configured to be switchable between analog and digital depending on the operation mode of the circuit 100.

In this description and in the claims, an I/O pin of a circuit means any input or output terminal of the circuit, regardless of the physical form of that terminal. Thus, the I/O pin need not be "pin-shaped" and need not even be a protrusion of any type. The principles of the present invention are not limited in any way to the form of the I/O pins, and thus the term "I/O pin" should be broadly construed.

The circuit 100 has at least two modes of operation (also called herein "operation modes"). For instance, some circuits have a normal operation mode and one or more alternative operation modes. Examples of alternative operating modes include, but are not limited to, configuration mode, testing mode, calibration mode, and verification mode.

In one embodiment of the present invention, one operation mode differs from another operation mode if the configuration or mode of any of its I/O pins is different at least for part of the time while in the operation mode. The configuration or mode of an I/O pin is whether or not the I/O pin is configured as an input pin, an output pin, or a combined input and output pin and/or what the decision parameters are for making such a decision. Alternatively or in addition, the configuration or mode of an I/O pin is whether or not the I/O pin is configured as a digital signal pin or an analog signal pin and/or what the decision parameters are for making that decision as well. In one embodiment, at least one of the I/O pins (even including a control I/O pin) is configurable to operate as an analog or digital signal pin, or switchable therebetween. For instance, a control pin may act as a digital input pin that is used to set the operation mode of the circuit 100, while acting in a different configuration as an analog pin (e.g., an analog input or output pin) when operating in the operation mode that is set through that same control pin. Alternatively, the control pin may act as a digital input pin that is used to set the operation mode of the circuit 100, while acting in a different configuration as an analog output pin when operating in the operation mode that is set through that same control pin. As a second alternative, the control pin may act as an analog input pin that is used to set the operation mode of the circuit 100, while acting in a different configuration as a digital output pin when operating in the operation mode that is set through that same control pin.

Figure 2:
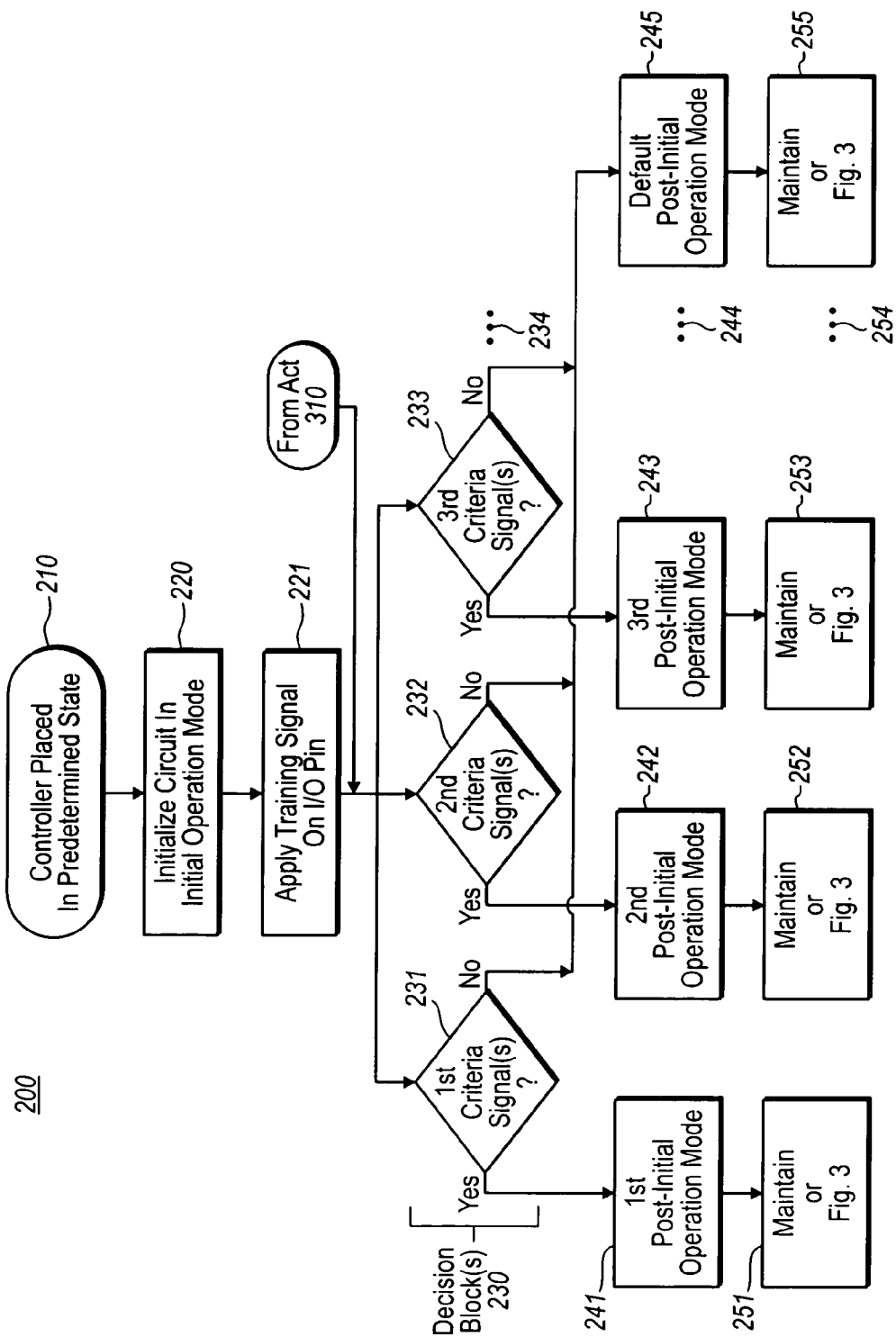
FIG. 2 illustrates a flowchart of a method for controlling the operation modes of the circuit in accordance with an embodiment of the present invention.

The controller 110 controls the various operation modes of the circuit 100. FIG. 2 illustrates a flowchart of a method 200 that may be implemented by the controller 110 to thereby control the operation modes of the circuit 100 in accordance with one embodiment of the present invention.

The method 200 may be implemented when the controller 110 is first placed in a known state. For instance, in FIG. 1, the controller 110 may be configured to automatically enter a known reset state when receiving a reset signal from the controller state reset component 140. In one embodiment, the controller state reset component 140 may be a power-on-reset component that is configured to signal the controller 110 when the circuit 100 has been powered up. In another embodiment, the controller state reset component 140 may be a reset pin, even though the controller state reset component 140 is symbolically illustrated as being included within the circuit 100.

Referring to FIG. 2, once the controller is placed in the predetermined state (act 210), the controller 110 initializes the circuit in an initial operation mode (act 220). As part of this initial operation mode, the controller 110 may cause a signal to be applied on one of the I/O pins (act 221). This signal might be, for example, a training signal which notifies external circuitry that the circuit 100 is in its initial "wait and see" mode, in which it is ready to receive instructions on which post-initial operation mode to enter next. External circuitry may use this training signal to identify proper timing for applying a return signal, or entering into signal-based negotiations with the circuit 100 to thereby allow the controller 100 to identify which of multiple possible post-initial operation modes to entered into based on those negotiations.

If the external circuitry applies signal(s) satisfying a predetermined criteria (also called herein a "first" predetermined criteria) to one or more of the I/O pins 120 that act as a control pin (yes in decision block 231), then the controller 110 causes the circuit 100 to transition from initial operation mode to the first post-initial operation mode (act 241). The controller does this by changing the configuration of the I/O pin if the circuit 100 has only one I/O pin, or by changing the configuration of one or more of the I/O pins if the circuit 100 has multiple I/O pins. In one embodiment, the signal(s) satisfying the predetermined criteria do not contain any overdrive voltages, but are voltage levels within the span of the voltage supplied provided to the circuit 100. Even the configuration of the control pin itself may be changed as a result of the transition 4 from the initial operation mode to the first operation mode.

In this description and in the claims, there is occasional reference to the terms "first", "second", "third" and so forth. Unless otherwise specified, the use of such terms is not used to imply sequential or positional ordering. Rather, the use of the terms is done merely to potentially distinguish one item from another. Furthermore, the use of the term "first", "second" and so forth in the description may not necessarily correlate to the use of such terms in the claims. Rather, the use of the terms in the claims tends to be in line with their order of introduction within the relevant chain of dependency.

Throughout this description and in the claims, whenever mentioning "one or more signals" or "signal(s)" being applied to the circuit, the signal(s) satisfying the criteria would be applied to the I/O pin if the circuit 100 has only one I/O pin, or would be applied to one or more of the I/O pins if the circuit 100 has multiple I/O pins. Furthermore, the signal (s) satisfying the predetermined criteria may be a single signal, or it may be multiple signals. If multiple signals, the signals may also be applied intermingled within a two-way negotiation between the circuit 100 and some external circuitry.

On the other hand, if the signal(s) satisfying the first predetermined criteria are not applied to I/O pin(s) of the circuit 100 (No in decision block 231), the controller 110 would cause the circuit 100 to transition from the initial operation mode to a default post-initial operation mode (act 245) if there were only two post-initial operation modes for the circuit 100, in which case, the default post-initial operation mode would be the second post-initial operation mode. In one embodiment, a timer (such as timer 130 of FIG. 1) enforces a predetermined time limit within which to make the decision 231. If signal(s) satisfying the predetermined criteria have not been received within that time limit (No in decision block 231), then the controller 110 may automatically transition the circuit 100 to the default post-initial operation mode (act 245).

Optionally, if there were only two post-initial operation modes, the controller 110 may not transition into the second post-initial operation mode (act 242) by default as described above, but only when signal(s) satisfying second predetermined criteria are applied to I/O pin(s) of the circuit 100 (Yes in decision block 232). In order to identify which post-initial operation mode to enter into, the satisfaction of the first predetermined criteria should be mutually exclusive of the satisfaction of the second predetermined criteria.

If there are more than two possible post-initial operation modes to which the circuit can transition into from the initial operation mode, the decision block 232 may distinguish whether to transition to the second post-initial operation mode (act 242) or to a third post-initial operation mode (act 243), and so forth.

Specifically, if signal(s) satisfying the first predetermined criteria are not applied to I/O pin(s) (No in decision block 231), but signal(s) satisfying the second predetermined criteria are applied to I/O pins (Yes in decision block 232), the controller 110 causes the circuit 100 to transition from the initial operation mode to the second post-initial operation mode (act 242). On the other hand, if signal(s) satisfying the first or second predetermined criteria are not applied to I/O pin(s) of the circuit 100 (No in decision blocks 231 and 232), the controller 110 would cause the circuit 100 to transition from the initial operation mode to a default post-initial operation mode (act 245). If there were only three post-initial operation modes for the circuit 100, the default post-initial operation mode may be the third post-initial operation mode. Once again and although not required, the timer 130 may enforces a predetermined time limit within which to make the decisions 231 and 232. If signal(s) satisfying the first and second predetermined criteria have not been received within that time limit (No in decision blocks 231 and 232), then the controller 110 may automatically transition the circuit 100 to the default post-initial operation mode (act 245).

Optionally, even if there were only three post-initial operation modes, the controller 110 may not transition into the third post-initial operation mode (act 243) by default as described above, but only when signal(s) satisfying third predetermined criteria are applied to I/O pin(s) of the circuit 100 (Yes in decision block 233). In order to identify which post-initial operation mode to enter into, the satisfaction of the third predetermined criteria should be mutually exclusive of the satisfaction of the first or second predetermined criteria.

If there are more than three possible post-initial operation modes to which the circuit can transition into from the initial operation mode, the decision block 233 may distinguish whether to transition to the third post-initial operation mode (act 243) or to a fourth post-initial operation mode, and so forth. As represented by the horizontal ellipses 234, 244 and 254, this reasoning may be continued for more than three decision blocks 230 if there are more than three post-initial operation modes to transition into depending on signal(s) applied to the I/O pin(s).

Regardless of which post-initial operation mode the controller 110 transitions the circuit 100 into (e.g., act 241 through 245), the controller 110 then allows the circuit 100 to be maintained (acts 251 through 255, respectively) in that operation until the next power cycle or until the next time the controller 110 is reset in the state (act 210) that caused it to begin the method 200 of FIG. 2.

Figure 3:
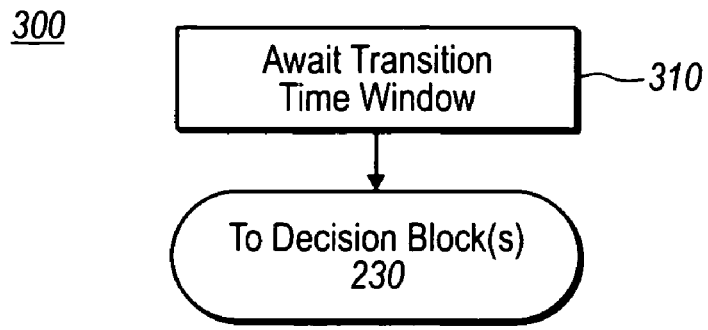
FIG. 3 illustrates a flowchart of a method for using time windows to facilitate transitions from one post-initial operation mode to another.

Alternatively, for one or more of the post-initial operation modes, the controller 110 may allow time windows within which to repeat the decision of which post-initial operation mode to be in (decision blocks 230). FIG. 3 illustrates this process. Specifically, the controller 110 maintains the circuit 100 in the most recent post-initial operation mode (acts 251, 252, 253, 254 or 255) until a window of time is next provided in which the circuit may be signaled to transition operation modes (act 310). The window of time need not be predetermined. The timer 130 may be used to identify to the controller that the window of time has arrived.

Once the controller 110 identifies through whatever means that the window of time has arrived, the controller 110 may place the circuit 100 in a condition in which it can receive signal(s) satisfying any of the predetermined criteria at the appropriate I/O pin(s). Optionally, the controller 110 may also signal external circuitry that the circuit 100 is in a condition to be influenced in terms of which post-initial operation mode to transition to. The controller 110 may then repeat decision blocks 230 as previously described. This window of time within which to allow post-initial operation modes to transition may occur only once, or may be repeated either at regular or irregular intervals.

Figure 4:
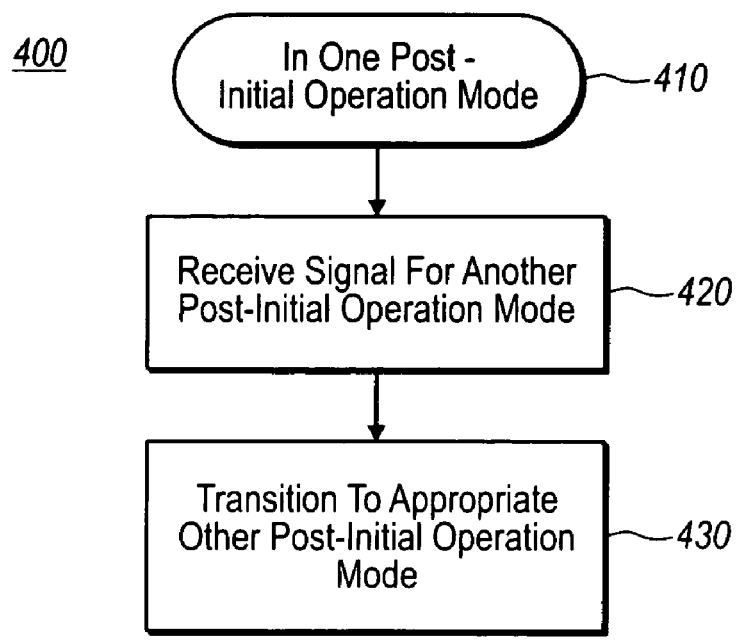
FIG. 4 illustrates a flowchart of a method for transitioning the circuit from one post-initial operation mode to another.

FIG. 4 illustrates a flowchart of a method 400 for transitioning the circuit 100 from one post-initial operation mode to another post-initial operation mode. If the circuit is in the one post-initial operation mode (act 410), and the circuit receives signal(s) satisfying predetermined criteria associate with another post-initial operation mode (act 420), then the controller 110 causes the circuit to transition to the appropriate operation mode corresponding to the predetermined criteria (act 430). Alternatively, an operation mode change command or an operation mode exit command may simply be used to cause a transition from one post-initial operation mode to another. Such a command may, but need not, conform to any predetermined criteria used to enter into a post-initial operation mode in the first place.

Figure 5:
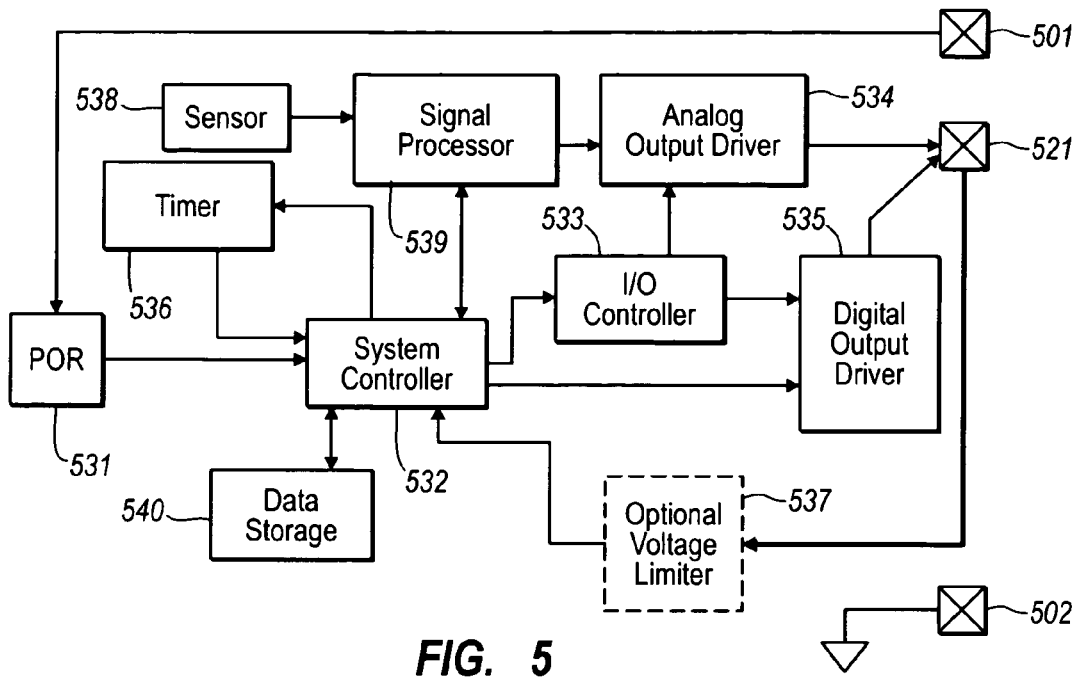
FIG. 5 schematically illustrates a circuit in accordance with a first more specific embodiment of the present invention.
Figure 6:
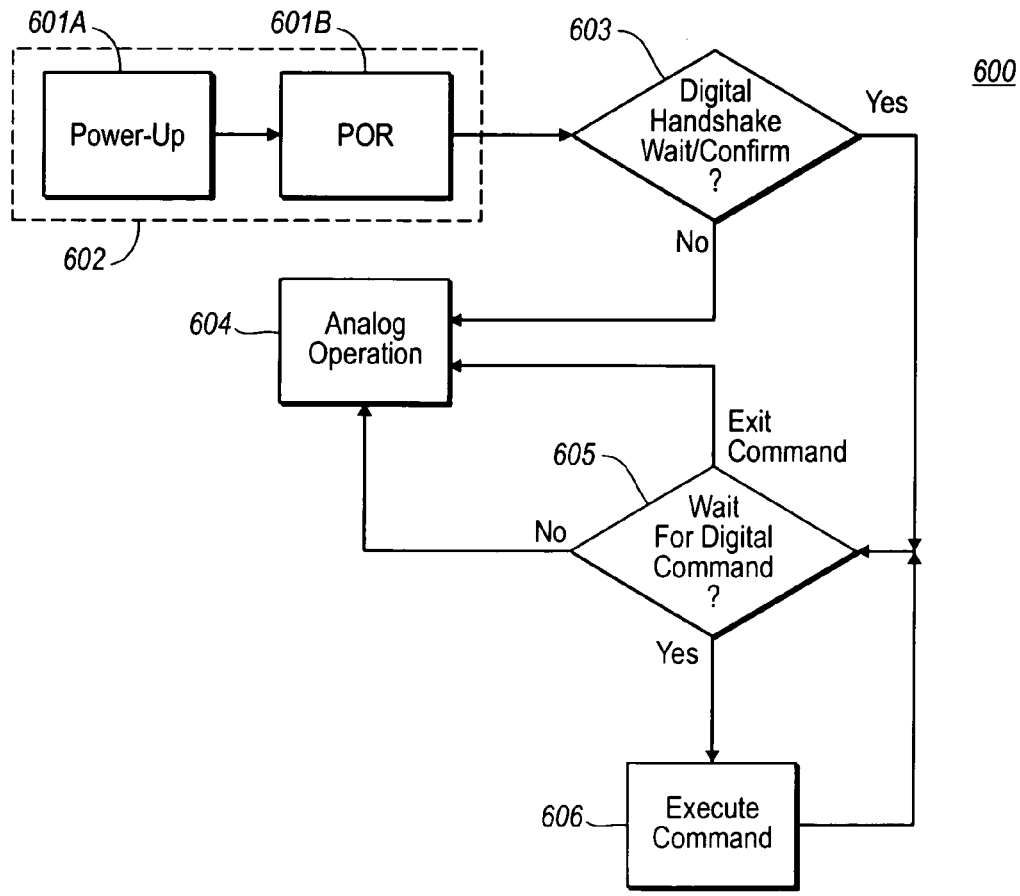
FIG. 6 illustrates a flowchart of a method for operating the circuit of FIG. 5 in accordance with one embodiment of the present invention.

FIG. 5 illustrates a circuit 500 that represents a more specific embodiment of the circuit 100 of FIG. 1. FIG. 6 illustrates a flowchart of a method 600 for controlling the various operation modes of the circuit 500 of FIG. 5. Accordingly, the circuit 500 of FIG. 5 will now be described with frequent reference to the method 600 of FIG. 6.

Initially, the controller 532 is placed in an initial predetermined state (act 602). This may be accomplished by powering up the circuit 500 (act 601A) thereby causing the controller to receive a Power-On-Reset (POR) signal (act 601B). Referring to FIG. 5, the circuit 500 includes two power supply pins, a high voltage supply pin 501 and a low voltage supply pin 502. The circuit 500 also includes a single I/O pin 521. Power is supplied when a high voltage is applied at the high voltage supply pin 501.

Once power is supplied to the circuit 500, the Power-On-Reset component 531 sends a reset signal to the system controller 532 (act 601B). The Power-On-Reset component 531 is an example of a controller state reset component 140 of FIG. 1. The controller 532 is an example of the controller 110 of FIG. 1. In response to the reset signal, the controller 532 resets into a known state in which it will initialize the circuit 500 into an initial operation mode.

In this specific example, the controller 532 uses the I/O controller 533 to disable the analog output driver 534, enable the digital output driver 535, and drive a digital signal onto the I/O pin 521. The controller 532 then starts the timer 536, disables the digital output driver 535 and await a signal to be applied to the I/O pin 521 by external circuitry (not shown).

If a signal satisfying predetermined criteria is received on the I/O pin 521, that signal is received either directly from pin 521 or regulated using the optional voltage limiter 537 at the controller 532. This may cause a negotiation to be initiated between the controller 532 and the external circuitry via the I/O pin 521, with the digital signal driver 535 being enabled as appropriate to allow the controller 532 to transmit any signals required for such negotiation.

If the negotiation is not initiated, or not completed successfully within a time period (No in decision block 603), the timer 536 signals the controller 532, which causes the controller 532 to transition the circuit 500 from the initial operation mode to a normal analog operation mode (act 604). In the normal operation mode, the digital output driver 535 is disabled and the analog output driver 534 is enabled. This allows sensed values of the sensor 538 to be processed by the signal processor 539. The output from the signal processor 539 may then be provided in analog form on the I/O pin 521.

If, on the other hand, the negotiation is completed successfully before time expires (Yes in decision block 603), the controller 532 causes the circuit 500 to transition to configuration mode. In configuration mode, the analog output driver 534 is disabled, and the digital output driver 535 is disabled. Then, the controller 532 awaits a digital configuration command (decision block 605). If a command is received (yes in decision block 605), the controller 532 executes the command (act 606) and awaits the next command (decision block 605). If an exit command is received (Exit Command in decision block 605), the controller 532 transitions to normal operation mode (act 604). Optionally, if a digital configuration command is not received for a predetermined time period (No in decision block 605), the controller 532 also transitions to normal operation mode (act 604). The configuration mode and normal operation mode are examples of post-initial operation modes. Examples of configuration commands may include a read command, in which the controller 532 provides data from the data storage 540 to the external circuitry over the I/O pin 521, a write command in which data is written from the I/O pin 521 to the data storage 540, and an auto-calibrate command, in which the controller 532 instructs the signal processor 539 to try various amplifier offsets until the sensor 538 is appropriately calibrated.

Figure 7:
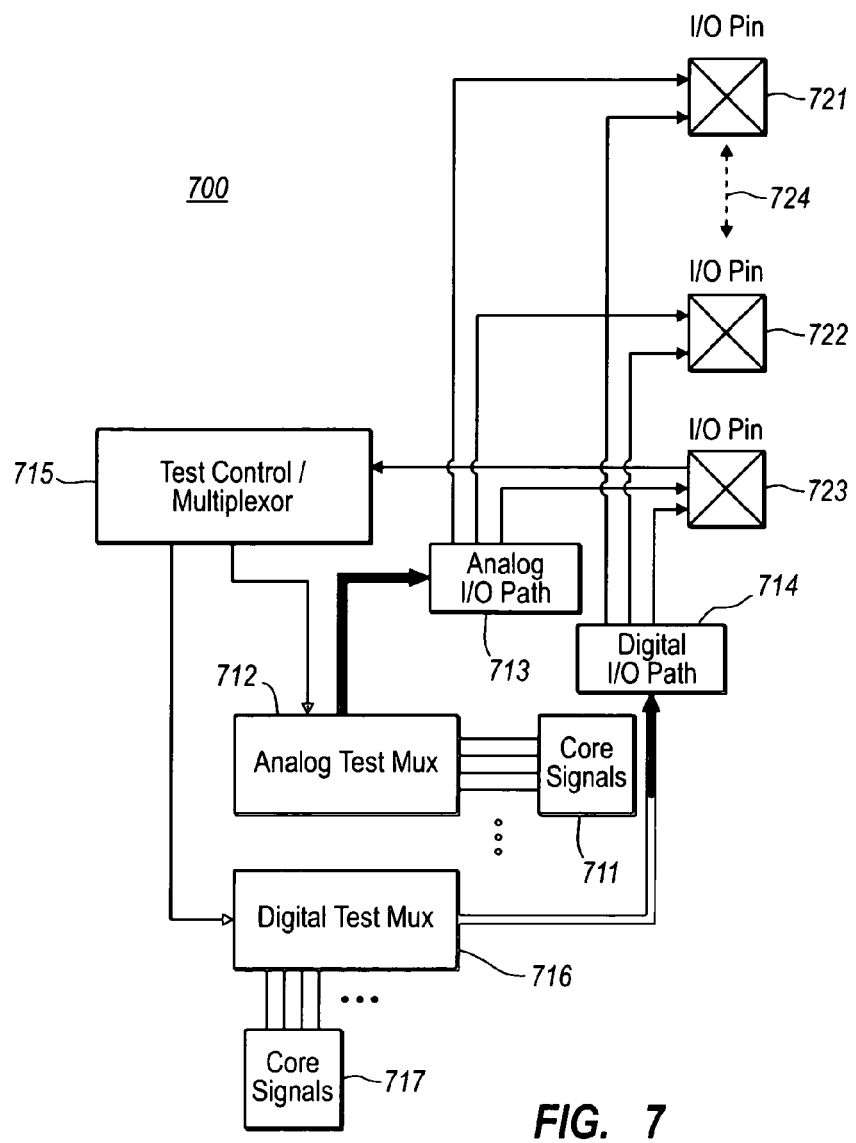
FIG. 7 schematically illustrates a circuit in accordance with a second more specific embodiment of the present invention.

FIG. 7 illustrates circuit 700 in accordance with a second more specific embodiment of the present invention. The circuit 700 includes analog core signals 711 and digital core signals 717. Often, in order to test the proper functionality of a circuit, it is not only necessary to have access to the I/O pins (such as I/O pins 721 through 723), but also to have access to the core signals of the circuit (such as core signals 711 and 717). Although four digital core signals and four analog core signals are illustrated in FIG. 7, there may be more or fewer than this number as represented by the corresponding ellipses. Furthermore, although only three I/O pins 721 through 723 are illustrated, there may be more or fewer I/O pins as represented by the bi-directional arrow 724. Finally, as with the other circuits described herein, there may be additional I/O pins within the circuit that are not illustrated that may act as dedicated digital pins or dedicated analog pins and/or dedicated input pins or dedicated output pins.

The analog test multiplexor 712 selects which analog signals 711 to access at the direction of the test control/multiplexor 715. The digital test multiplexor 716 selects which digital signals 717 to access also at the direction of the test control/multiplexor 715.

The analog I/O path 713 may include one or more associated analog output driver(s) connected to the I/O pins 721 through 723 so as to selectively enable or disable the ability to drive analog signals on the pins 721 through 723. The analog I/O path 713 may also configure the I/O pins as analog input. This would enable analog signals to be applied to the pins to thereby permit analog stimulus to be received into the circuit 700. Similarly, the analog output driver may be enabled to permit analog signals representing, for example, measurements to be provided outside the circuit 700.

Likewise, the digital I/O path may include one or more associated digital output driver(s) that connect the I/O pins 721 through 723 so as to selectively enable or disable the ability to drive digital signals on the pins 721 through 723. The digital I/O path may also configure the I/O pins as digital and may be used to configure the I/O pins as digital output, digital input, and digital output and input.

At power-up, the test control/multiplexor 715 optionally causes a training signal to be sent over one of the I/O pins 721 through 723, whichever is then configured as a digital output or digital bidirectional pin, although the training signal might also be an analog signal. A signal may then be received through that same pin or through another I/O pin. For instance, in the initial operation mode that the circuit 700 enters into when the controller 715 enters a known initial state, the I/O pin 723 may be configured as an input pin in which it may act as a control pin. The signal may be applied on that control pin 723. If the signal is evaluated as a test mode initiation signal, the test control/multiplexor 715 causes the circuit 700 to enter the test mode. In this mode, the I/O pins 721 through 724 become test pins, which may be used to communicate which of the core signals are desired to be tested. Note that when configuring the I/O pins 721 through 724, that the control I/O pin 723 itself is configured as an output pin, even though it served as an input pin used to initiate the transition of the operation modes to the testing operation mode. The test control/multiplexor 715 responds by controlling the analog and digital text multiplexors 712 and 716 to apply the appropriate signals to the I/O pins 721 through 724. The test mode may be exited either by performing a power cycle, or by receiving an exit test mode command. In this case, the first post-initial operation mode would be test mode, whereas the second post-initial operation mode would be non-test mode.

Figure 8:
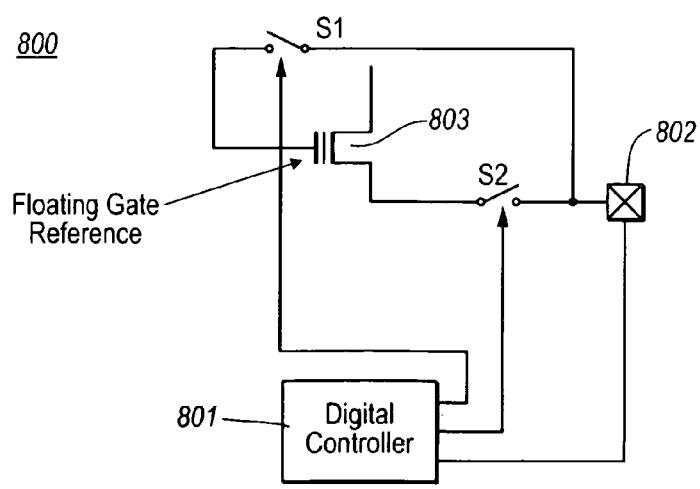
FIG. 8 schematically illustrates a circuit in accordance with a third more specific embodiment of the present invention.

FIG. 8 illustrates a schematic block diagram of a circuit 800 in accordance with a third specific embodiment of the present invention. The circuit is a voltage reference circuit that includes a digital controller 801, an I/O pin 802, a voltage reference cell (e.g., in the form of a floating gate transistor 803), and switches S1 and S2 configured as shown. By adjusting the voltage applied to the control terminal of the voltage reference cell, the voltage at the output terminal of the voltage reference may be adjusted until it reaches within acceptance tolerances given the application. In the specific illustrated embodiment, the voltage at the lower terminal of the floating gate transistor 803 is adjusted by programming or erasing charge from the floating gate of the floating gate transistor.

Upon power-up, the digital controller 801 enters an initial wait-and-see operation mode in which the circuit 800 awaits external instructions on whether the circuit 800 is to enter a first post-initial operation mode in which the circuit 800 is calibrated, or a second post-initial operation mode in which the circuit 800 acts as a voltage reference.

If the circuit receives an instruction to enter the calibration mode, the digital controller 801 closes switch S1 and opens switch S2. This permits an external circuit to apply a voltage to the gate of the floating gate transistor 803 through I/O pin 802, thereby charging or discharging the floating gate through Fowler-Nordheim tunneling. The digital controller 801 then closes the switch S2 and opens switch S1, to allow the resulting reference voltage to be applied to the I/O pin. This process is repeated through as many iterations as needed to obtain an acceptable reference voltage. Accordingly, in calibration mode, the I/O pin 802 alternates between an analog input pin and an analog output pin.

The calibration mode may be exited once the digital controller detects analog and/or digital signals applied to the I/O pin 802 indicative of a command to exit. At that point, the digital controller configures the I/O pin 802 as a permanent analog output pin, closes switch S2, and opens switch S1, thereby enabling the circuit 800 to enter the voltage reference post-initial operation mode.

Figure 9:
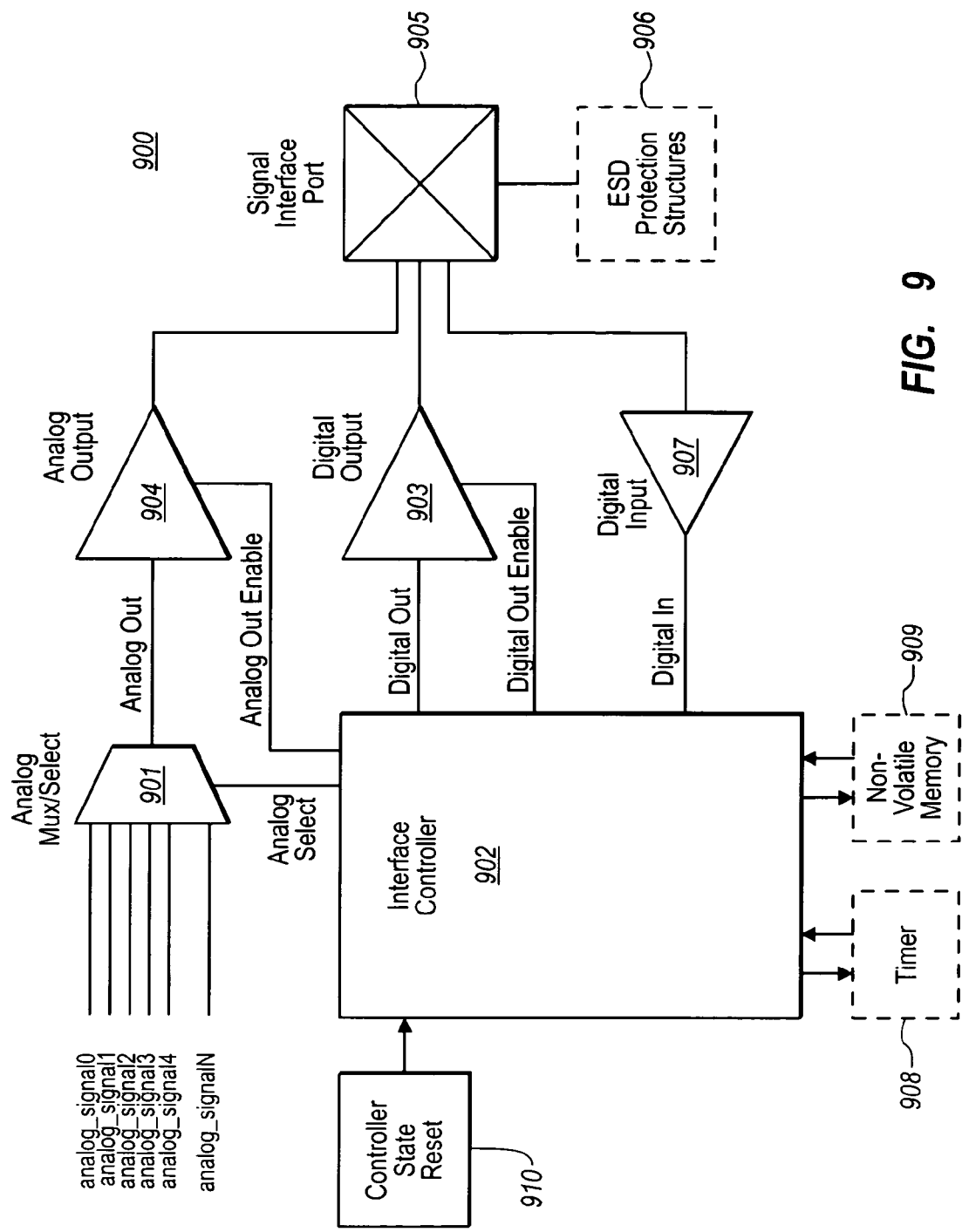
FIG. 9 schematically illustrates a circuit in accordance with a fourth more specific embodiment of the present invention.

FIG. 9 illustrates a circuit block diagram of a circuit 900 in accordance with a fourth specific embodiment of the present invention. In this embodiment, there are multiple analog signal generators that generate signals analog_signal0 through analog_signalN that are supplied to a multiplexor 901, which provides the selected analog signal in the form of signal AnalogOut in response to the AnalogSelect signal provided by the interface controller 902.

When the controller of the circuit 900 enters a known initial state (act 1001 of FIG. 10) in response to the signal from the controller state reset component 910, the circuit 900 enters a wait-and-see or initial operation mode (act 1002 of FIG. 10) in which the digital output driver 903 is disabled, and the analog output driver 904 is disabled. The circuit 900 then awaits a command signal to be applied to the signal interface port 905, which optionally has some Electro-Static Discharge (ESD) protection structures 906. The command signal as applied through the digital input driver 907 to the interface controller 902.

Figure 10:
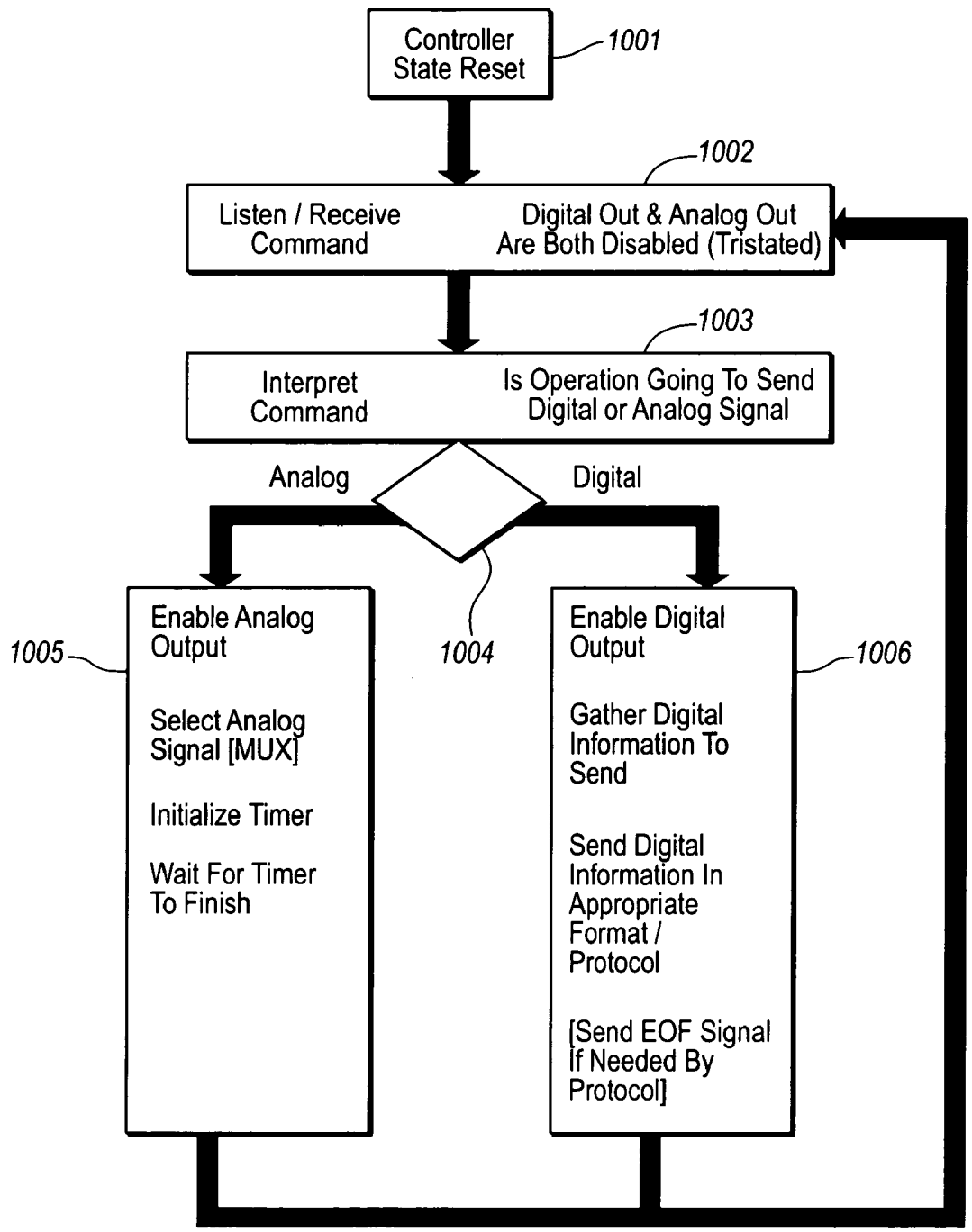
FIG. 10 illustrates a flowchart of a method for operating the circuit of FIG. 9 in accordance with one embodiment of the present invention.

The interface controller 902 then interprets the command (act 1003 of FIG. 10). If the command requires analog output (Analog in decision block 1004), the analog output is enabled using the AnalogOutEnable signal, the appropriate analog signal is selected using the AnalogSelect signal(s), and the appropriate signal analog_signal0 through analog_signalN is applied to the signal interface port. Optionally, the timer 908 is initialized. All of this is represented by act 1005 of FIG. 10. When the timer 908 expires, the analog output driver 904 is once again disabled, and the circuit 900 waits for the next command (act 1002).

If, on the other hand, a command is received that requires digital output (Digital in decision block 1004), the digital output driver 903 is enabled, the required digital information is gathered and sent in the appropriate format (act 1006) using the digital output driver 903. In this example, the initial operation mode may be the wait and see mode in which the I/O pin 905 operates as digital input pin. The digital output mode may be the first post-initial operation mode in which digital information is provided in response to a command that required digital output. The analog output mode may be the second post-initial operation mode in which digital information is provided in response to a command that required analog output.

Accordingly, the principles of the present invention allow a circuit to be initialized in an initial operation mode, and then allows external circuitry to control the next operating mode that the circuit enters into. This permits advantages such as reduced pin count, since the operation modes may be conveniently adjusted to use a pin more efficiently by changing its configuration as needed to accomplish the purpose of the operating mode. Furthermore, the external circuitry may control the operation mode without applying overdrive voltages to the I/O pin, and without having to modulate the power supply.

The present invention may be embodied in other specific forms without departing from its spirit or essential characteristics. The described embodiments are to be considered in all respects only as illustrative and not restrictive. The scope of the invention is, therefore, indicated by the appended claims rather than by the foregoing description. All changes which come within the meaning and range of equivalency of the claims are to be embraced within their scope.

What is claimed is:

1. A circuit comprising:
   a controller; and
   a control I/O pin, wherein the controller is configured to perform the following when the controller is placed into an initial state:
      an act of initializing the circuit in an initial operation mode;
      an act of transitioning the circuit from the initial operation mode to a first post-initial operation mode if one or more signals satisfying predetermined criteria are applied to the control I/O pin; and
      an act of transitioning the circuit from the initial operation mode to a second post-initial operation mode if the one or more signals satisfying the predetermined criteria are not applied to the control I/O pin,
      wherein a mode of the control I/O pin differs depending on whether the circuit is in the first post-initial operation mode or in the second post-initial operation mode.

2. The circuit in accordance with claim 1, wherein the mode of the control I/O pin represents whether or not the control I/O pin is configured as an input pin, an output pin, or a combined input and output pin.

3. The circuit in accordance with claim 2, wherein the mode of the control I/O pin represents whether or not the control I/O pin is configured as a digital signal pin or an analog signal pin.

4. The circuit in accordance with claim 1, wherein the mode of the control I/O pin represents whether or not the control I/O pin is configured as a digital signal pin or an analog signal pin.

5. The circuit in accordance with claim 1, wherein the first post-initial operation mode is a configuration mode in which the control I/O pin is configured as a digital signal pin.

6. The circuit in accordance with claim 5, wherein the second post-initial operation mode is a mode in which the control I/O pin is configured as an analog output pin.

7. The circuit in accordance with claim 6, wherein the control I/O pin behaves in normal non-configuration operation mode when the circuit is in the second post-initial operation mode.

8. The circuit in accordance with claim 1, wherein the predetermined criteria are first predetermined criteria, wherein the act of transitioning the circuit from the initial operation mode to a second post-initial operation mode if one or more signals satisfying the predetermined criteria are not applied to the control I/O pin comprises:
   an act of transitioning the circuit from the initial operation mode to the second post-initial operation mode if one or more signals satisfying a second predetermined criteria are applied to the control I/O pin, wherein satisfaction of the second predetermined criteria is mutually exclusive of satisfaction of the first predetermined criteria.

9. The circuit in accordance with claim 8, wherein the controller is further configured to perform the following:
   an act of transitioning the circuit from the initial operation mode to a third post-initial operation mode if neither one or more signals satisfying the first predetermined criteria nor one or more signals satisfying the second predetermined criteria are applied to the control I/O pin.

10. The circuit in accordance with claim 9, wherein the controller is further configured to transition the circuit from the initial operation mode to one or more other operation modes depending on one or more signals applied at the control I/O pin.

11. The circuit in accordance with claim 1, wherein the predetermined criteria are first predetermined criteria, wherein the act of transitioning the circuit from the initial operation mode to a second post-initial operation mode if one or more signals satisfying the predetermined criteria are not applied to the control I/O pin comprises:
   an act of transitioning the circuit from the initial operation mode to the second post-initial operation mode regardless of whether one or more signals not satisfying the first predetermined criteria are applied to the control I/O pin.

12. The circuit in accordance with claim 11, further comprising:
   a timer configured to signal the controller when a predetermined time period has expired, wherein the controller is configured to await for the predetermined time period for the one or more signals that satisfy the first predetermined criteria before automatically transitioning to the second post-initial operation mode.

13. The circuit in accordance with claim 1, wherein the controller is further configured to perform the following during the initial operation mode:
an act of the controller causing a signal to be applied to the control I/O pin.

14. The circuit in accordance with claim 1, wherein the controller is configured to perform the following if in the second post-initial operation mode:
an act of maintaining the circuit in the second post-initial operation mode until a next power cycle.

15. The circuit in accordance with claim 1, wherein the predetermined criteria are first predetermined criteria wherein the controller is configured to perform the following if in the second post-initial operation mode:
an act of maintaining the circuit in the second post-initial operation mode until a window of time is next provided in which the circuit may be signaled to transition operation modes;
during the window of time, an act of configuring the control I/O pin as an input pin;
during the window of time, an act of detecting that one or more signals satisfying a second predetermined criteria is received at the control I/O pin, wherein the second predetermined criteria may be the same as or different than the first predetermined criteria; and
in response to the act of detecting, an act of transitioning the circuit from the second post-initial operation mode to a third post-initial operation mode.

16. The circuit in accordance with claim 15, wherein the third post-initial operation mode and the first post-initial operation mode are the same.

17. The circuit in accordance with claim 15, wherein the third post-initial operation mode and the first post-initial operation mode are different.

18. The circuit in accordance with claim 1, wherein the predetermined criteria are first predetermined criteria, and wherein the controller is further configured to perform the following if the circuit is in the first post-initial operation mode:
an act of transitioning the circuit from the first post-initial operation mode to the second post-initial operation mode if one or more signals satisfying second predetermined criteria are applied to the control I/O pin, wherein the second predetermined criteria may be the same as or different than the first predetermined criteria.

19. The circuit in accordance with claim 1, further comprising:
a controller state reset component configured to reset the controller to a known state.

20. The circuit in accordance with claim 1, further comprising:
one or more other I/O pins, wherein a state of at least one of the one or more other I/O pins differs depending on whether or not the circuit is in the first post-initial operation mode or in the second post-initial operation mode.

21. A circuit comprising:
a controller; and
at least one I/O pin, wherein the controller is configured to perform the following when the controller is placed into an initial state:
an act of initializing the circuit in an initial operation mode;
an act of transitioning the circuit from the initial operation mode to a first post-initial operation mode if one or more signals satisfying predetermined criteria are applied to one or more control I/O pins of the at least one I/O pin; and
an act of transitioning the circuit from the initial operation mode to a second post-initial operation mode if the one or more signals satisfying the predetermined criteria are not applied to one or more control I/O pins of the at least one I/O pin,
wherein either the first or second post-initial operation mode consists of a normal operation mode or an abnormal operation mode consisting of at least one of configuration mode, testing mode, calibration mode, verification mode or another abnormal operation mode,
wherein at least one of the one or more control I/O pins is configurable to be switchable between analog and digital.

22. The circuit in accordance with claim 21, wherein a mode of at least one of the one of more control I/O pins differs depending on whether or not the circuit is in the first post-initial operation mode or the second post-initial operation mode.

23. The circuit in accordance with claim 22, wherein the mode of the at least one of the one or more control I/O pins represents whether or not the control I/O pin is configured as an input pin, an output pin, or a combined input and output pin.

24. The circuit in accordance with claim 22, wherein the mode of the at least one of the one or more control I/O pins represents whether or not the control I/O pin is configured as a digital signal pin or an analog signal pin.

25. The circuit in accordance with claim 22, further comprising:
a timer configured to signal the controller when a predetermined time period has expired,
wherein the controller is configured to await for the predetermined time period for the one or more signals that satisfy the predetermined criteria before automatically transitioning the circuit to the second post-initial operation mode.

26. A circuit comprising:
a controller;
a controller state reset component configured to reset a state of the controller into a predetermined state; and
at least one I/O pin, wherein the controller is configured to perform the following upon being placed into the initial state by the controller state reset component:
an act of initializing the circuit in an initial operation mode;
an act of transitioning the circuit from the initial operation mode to a first post-initial operation mode if one or more signals satisfying predetermined criteria are applied to one or more control pins of the at least one I/O pin; and
an act of transitioning the circuit from the initial operation mode to a second post-initial operation mode if the one or more signals satisfying the predetermined criteria are not applied to one or more control pins of the at least one I/O pin,
wherein at least one of the one or more control I/O pins is configurable to be switchable between analog and digital,
wherein a mode of at least one of the one or more control I/O pin differs depending on whether the circuit is in the first post-initial operation mode or in the second post-initial operation mode.

27. The circuit in accordance with claim 26, wherein the mode of at least one of the one or more control I/O pins represents whether or not the control I/O pin is configured as an input pin, an output pin, or a combined input and output pin.

28. A circuit comprising
a controller;

a controller state reset component configured to reset a state of the controller into a predetermined state; and at least one I/O pin, wherein the controller is configured to perform the following upon being placed into the initial state by the controller state reset component:

an act of initializing the circuit in an initial operation mode;

an act of transitioning the circuit from the initial operation mode to a first post-initial operation mode if one or more signals satisfying predetermined criteria are applied to one or more control pins of the at least one I/O pin; and an act of transitioning the circuit from the initial operation mode to a second post-initial operation mode if the one or more signals satisfying the predetermined criteria are not applied to one or more control pins of the at least one I/O pin, wherein at least one of the one or more control pins is configurable to be switchable between analog and digital, wherein the mode of the at least one of the one or more control pins represents whether or not the control pin is configured as a digital signal pin or an analog signal pin.

29. A circuit comprising:

a controller;

at least one I/O pin;

a timer, wherein the controller is configured to perform the following being placed in an initial state:

an act of initializing the circuit in an initial operation mode;

an act of transitioning the circuit from the initial operation mode to a first post-initial operation mode if one or more signals satisfying predetermined criteria are applied to one or more control pins of the at least one I/O pin before the timer indicates that time has expired; and an act of transitioning the circuit from the initial operation mode to a second post-initial operation mode if the one or more signals satisfying the predetermined criteria are not applied to the one or more control pins of the at least one I/O pin before the timer indicates that time has expired wherein at least one of the one or more control pins is configurable to be switchable between analog and digital.

30. The circuit in accordance with claim 29, wherein the predetermined criteria are first predetermined criteria, wherein the controller is configured to perform the following if in the first post-initial operation mode:

an act of maintaining the circuit in the first post-initial operation mode until a window of time is next provided in which the circuit may be signaled to transition operation modes;

during the window of time, an act of configuring at least one of the one or more control I/O pins as an input pin;

during the window of time, an act of detecting that one or more signals satisfying a second predetermined criteria is received at the control I/O pin, wherein the second predetermined criteria may be the same as or different than the first predetermined criteria; and in response to the act of detecting, an act of transitioning the circuit from the first post-initial operation mode to a third post-initial operation mode.

31. The circuit in accordance with claim 29, wherein a state of at least one of the one or more control pins differs depending on whether or not the circuit is in the first post-initial operation mode or the second post-initial operation mode.

* * * * *